(12) United States Patent  
Oh

(10) Patent No.: US 8,769,193 B2
(45) Date of Patent: Jul. 1, 2014

(54) NUMERIC REPRESENTATION TO IMPROVE LIFE OF SOLID STATE STORAGE DEVICES

(75) Inventor: Hyun Oh Oh, Gyeonggi-do (KR)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 13/809,384

(22) PCT Filed: Apr. 30, 2012

(86) PCT No.: PCT/US2012/035900
§ 371 (c)(1),
(2), (4) Date: Jan. 9, 2013

(87) PCT Pub. No.: WO2013/165378
PCT Pub. Date: Nov. 7, 2013

(65) Prior Publication Data
US 2013/0339579 A1    Dec. 19, 2013

(51) Int. Cl.
*G06F 12/00* (2006.01)
*G06F 13/00* (2006.01)
*G06F 13/28* (2006.01)

(52) U.S. Cl.
USPC .......................................... 711/103; 711/154

(58) Field of Classification Search
USPC ................................................ 711/103, 154
See application file for complete search history.

(56) References Cited

U.S. PATENT DOCUMENTS

| 2003/0041210 | A1 | 2/2003 | Keays |
| 2009/0259803 | A1* | 10/2009 | Oh et al. ...................... 711/103 |
| 2009/0327580 | A1 | 12/2009 | Hamilton et al. |
| 2010/0235569 | A1 | 9/2010 | Nishimoto et al. |
| 2011/0246710 | A1* | 10/2011 | Strope ......................... 711/103 |
| 2011/0264847 | A1 | 10/2011 | Hsiao |
| 2012/0297109 | A1* | 11/2012 | Guthrie et al. ..................... 711/3 |
| 2013/0103891 | A1* | 4/2013 | Sharon et al. ................. 711/103 |

FOREIGN PATENT DOCUMENTS

WO    2006097917 A2    9/2006

OTHER PUBLICATIONS

Jiang, A., et al Data representation for flash memories, Computer and Information Science, Information and Knowledge Engineering, "Data Storage", Chapter 4, pp. 53-74, InTech, Apr. 1, 2010.
Wikipedia, Two's complement, accessed online on Jan. 8, 2013 via http://en.wikipedia.org/wiki/Two's_complement.
Wikipedia, Signed number representations, accessed online on Jan. 8, 2013 via http://en.wikipedia.org/wiki/Signed_number_representations.
United States Patent and Trademark Office, International search report and written opinion of the International searching authority for PCT/US2012/035900, mailed on Dec. 26, 2012, USA.

* cited by examiner

*Primary Examiner* — Ryan Bertram

(57) ABSTRACT

Technologies and implementations for improving life of a solid state storage device are generally disclosed.

23 Claims, 7 Drawing Sheets

| | 102 | 104 | 106 | 108 | |
|---|---|---|---|---|---|
| | Decimal | Two's Complement Binary | Transformed Binary | Hexadecimal | |
| | 32767 | 0111 1111 1111 1111 | 1000 0000 0000 0000 | 0x7FFF | |
| | .... | .... | .... | .... | |
| | 2 | 0000 0000 0000 0010 | 1111 1111 1111 1101 | 0x0002 | |
| | 1 | 0000 0000 0000 0001 | 1111 1111 1111 1110 | 0xFFFE | 100 |
| | 0 | 0000 0000 0000 0000 | 1111 1111 1111 1111 | 0xFFFF | |
| | -1 | 1111 1111 1111 1111 | 0111 1111 1111 1111 | 0x0000 | |
| | -2 | 1111 1111 1111 1110 | 0111 1111 1111 1110 | 0x0001 | |
| | .... | .... | .... | .... | |
| | -32768 | 1000 0000 0000 0000 | 0000 0000 0000 0000 | 0x8000 | |

Fig. 1

| 600 | Computer Program Product |

| 602 | Signal Bearing Medium |

604 A machine readable non-transitory medium having stored therein instructions that, when executed by one or more processors, operatively enable a memory control module to:

receive data for a write operation;

convert the received data into a complementary representation data; and write the complementary representation data into a solid state storage device, wherein the complementary representation data is substantially the size as compared to the received data and optimized for storage into the solid state storage device.

| 606 Computer Readable Medium | 608 Recordable Medium | 610 Communication Medium |

Fig. 6

NUMERIC REPRESENTATION TO IMPROVE LIFE OF SOLID STATE STORAGE DEVICES

BACKGROUND

Unless otherwise indicated herein, the approaches described in this section are not prior art to the claims in this application and are not admitted to be prior art by inclusion in this section.

Storage systems may include solid state storage devices such as a solid state drive (SSD). The SSD may comprise of a multitude of semiconductor devices. Over time, as data is written and read from the SSD, these semiconductor devices may experience wear, which may lead to data being corrupted and/or lost, diminishing the life of the SSD.

SUMMARY

The present disclosure describes some example methods, apparatus, and systems for improving life of a solid state storage device. The solid state storage device may include a memory control module. Some example methods may include, at the memory control module, receiving data for a write operation, converting the received data into a complementary representation data, where the complementary representation data may be substantially the same size as compared to the received data and optimized for storage into the solid state storage device, and writing the complementary representation data into the solid state storage device.

Some example apparatus may include a machine readable non-transitory medium having stored therein instructions. The instructions, when executed by one or more processors, may operatively enable a memory control module to receive data for a write operation, convert the received data into a complementary representation data, where in some examples, the complementary representation data may be substantially the same size as compared to the received data and optimized for storage into the solid state storage device, and write the complementary representation data into the solid state storage device.

Some example systems may include a solid state drive (SSD) and a memory control module communicatively coupled to the SSD. Additionally, memory control module may be configured to receive data for a write operation, convert the received data into a complementary representation data, and write the complementary representation data into the SSD.

The foregoing summary is illustrative only and not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure, and are therefore, not to be considered limiting of its scope. The disclosure will be described with additional specificity and detail through use of the accompanying drawings.

In the drawings:

FIG. 1 is a table illustrating a data representation for numeric data having a transformed binary format, in accordance with various embodiments disclosed herein;

DETAILED DESCRIPTION

Figure 2A:
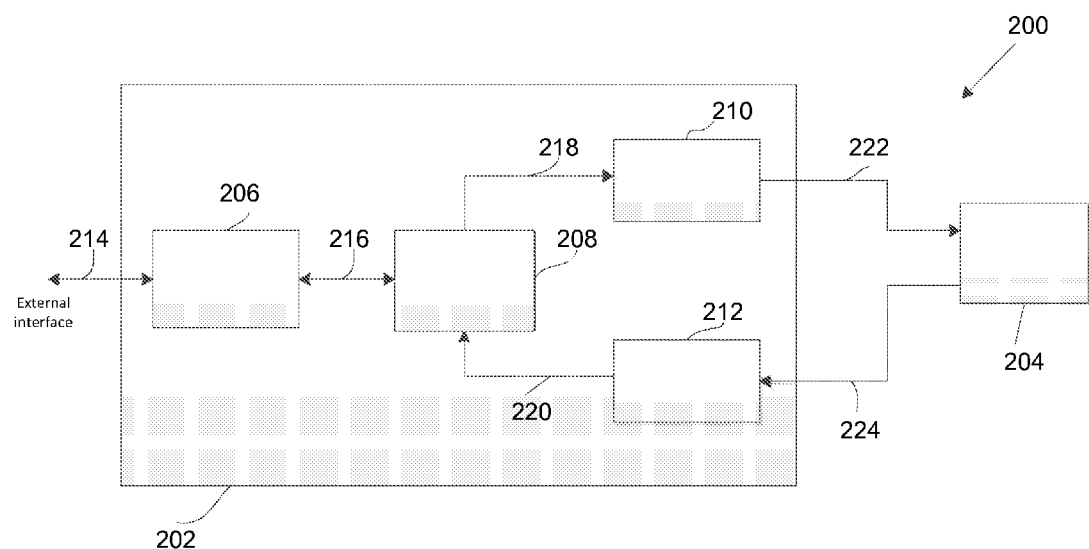
FIGS. 2A and 2B illustrate an example system that is arranged in accordance with at least some embodiments of the present disclosure.

The following description sets forth various examples along with specific details to provide a thorough understanding of claimed subject matter. It will be understood by those skilled in the art that claimed subject matter may be practiced without some or more of the specific details disclosed herein. Further, in some circumstances, well-known methods, procedures, systems, components and/or circuits have not been described in detail, in order to avoid unnecessarily obscuring claimed subject matter.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, devices, systems and computer readable media related to improving life of a solid state storage device.

In general, solid state storage devices may be considered to be prevalent. There may be a wide variety of solid state storage devices such as, but not limited to, non-volatile memory including flash memory (NOR type flash memory or NAND type flash memory). Additionally, solid state storage devices may include volatile memory including random access memory (RAM), dynamic RAM (DRAM), or synchronous RAM (SRAM). One application of a solid state storage device may be to replace traditional electro-mechanical hard disk drive (HDD) with solid state storage device such as, but not limited to, solid state drive (SSD).

In contrast to the HDD, the SSD may utilize semiconductor devices to store data while facilitating access to the data stored in the SSD in a similar manner as the HDD. The utilization of the semiconductor devices may result in the SSD allowing for faster access time and/or lower power consumption than the HDD. However, the faster access time and/or lower power consumption may come at a price, for example, the semiconductor devices may function for a limited time before the semiconductor devices deteriorate and can no longer provide reliable storage of data.

The semiconductor devices may deteriorate because of a manner in which the data may be stored and accessed in the SSD. For an example of a binary data system, default state of memory cells in a block may be "1" due in part on the electrical nature of the semiconductor devices. Accordingly, during an erase operation, memory cells in the block may be initialized to a value "1". During the erase operation, memory cells with a value of "1" may not change, while the memory cells with a value of "0" may be changed from "0" to "1". Thus, the memory cells having a value changed from "1" to "0" by a write operation may have more wear than the memory cells having the value retained as "1". Therefore, reducing the quantity of "0" writes during a write operation may reduce instances of future over-writing or erasing operations, and thereby, may reduce the wear of the SSD.

One method for representing data may involve using a two's complement representation of the data, which may provide computationally simplified arithmetic. Because of the simplified arithmetic operations available for data stored in two's complement format, computer systems may frequently store a large portion of their data in two's complement format. However, the two's complement format may increase wear of an SSD when storing statistically likely numbers.

For example, frequency of stored integer values may not follow a uniform distribution, but instead statistical distribution of stored data may dominantly favor numbers with smaller absolute values. Common data values may tend to be those having values whose two's complement representations may statistically likely include a larger number of "0" bits, which may increase wear. Additionally, the two's complement representations of smaller positive numbers may also tend to have a larger number of "0" bits, which may also increase wear.

As will be discussed in greater detail below, accessing (e.g., writing and reading/programming and erasing) may be performed in a manner to improve life of an SSD. In some examples, accessing may include converting data being written to the SSD.

In general, transformation of data from a source numeric representation (such as two's complement) to an SSD formatted numeric representation (such as disclosed herein) may be performed at various stages in an input/output (I/O) operation. Likewise, an inverse transformation of an example SSD formatted numeric representation to a source numeric representation may be performed in any of the same stages, or in any combination of stages. For example, a computer program process run as an application may be operable to store SSD formatted numbers either through bit representations of the numbers in the application itself or in some examples with the help of a data type defined by a library, preprocessor, compiler, or linker, or any combination thereof. In another example, the Operating System may be configured to output SSD-Format to associated SSD devices, for example as a storage format associated with the File System, in a Logical Volume Manager configured to distinguish SSD volumes from a volume group, as a device driver for the SSD physical device, and/or in a Flash Translation Layer (FTL). Additionally, the translations may be performed using an apparatus or system of logic such as used in a typical computer and may be performed in the system memory, on the peripheral bus, on a network, or at the SSD, or any combination thereof.

In some embodiments, a particular data set may be known to contain a non-zero mean value. In this case, the transformation may be performed for a difference value after removing the non-zero mean value by an offset, where the offset may be selected to move the mean value to zero. The offset may be known or knowable to facilitate the inverse transformation to recover stored data. In some examples, the offset may be associated with the saved data and stored separately, for example in a file system. In some examples, the distribution of the data may be an inherent quality and may be known without requiring to save the offset.

FIG. 1 is a table 100 illustrating a data representation for numeric data having a transformed binary format, in accordance with various embodiments disclosed herein. The table 100 includes an integer, which may be expressed as a decimal number 102, as a binary number in two's complement form 104, or as a transformed binary number 106. Although the table illustrates 16-bit numbers, any other number of bits may be employed as may be necessary for in various implementations.

The decimal number 102 may be illustrated as a column representing the decimal format of the integer, where a positive number may be expressed without a sign and a negative number may be expressed with a minus sign. The two's complement binary 104 may be illustrated as a column representing the integer in two's complement binary form. The two's complement number system may be employed to encode positive and negative numbers into a binary number representation.

The two's complement of a binary number may be determined by determining it's one's complement and adding one. The one's complement of a number may be determined by inverting the bits in the binary representation of the number.

As previously described, computer data may be stored in two's complement format. As a non-limiting example, the numbers {2, 1, 0, −1, −2} when taken as a whole may be a representative set of five integers that may be statistically likely to be written to a disk. For purposes of simplicity in describing the disclosed subject matter, the set of integers has been chosen in part because each integer may have a small absolute value that may fit with an example statistical distribution and to provide an example to help describe the number formats provided in FIG. 1. It should be appreciated that any other data may be be used, and accordingly, the claimed subject matter is not limited in these respects. The numbers may be represented using two's complement binary format as illustrated in column 104 in the rows corresponding to {2, 1, 0, −1, −2}. Each two's complement number may be represented using 16 bits, and the five numbers of the example may correspond to 80 total bits (16 bits×5) representing the five example integers. In this example, 47 of the 80 two's compliment binary bits may be "0"s. Storing these 80 bits to an SSD may require setting 47 bits from a "1" to a "0", which in turn may cause wear on the SSD.

As will be described in greater detail in FIG. 4, an example transformation from the two's complement binary format into a SSD format may reduce wear on the SSD. In some examples, the transformation may be implemented as follows: (1) begin with an integer represented in a two's complement format, (2) determine the sign of the integer, (3) if positive (including zero), then take the 1's complement of the integer, (4) else if negative, then clear the sign bit by making the most significant bit "0". Determination of the sign of an integer in two's complement binary format may be performed by examining the sign bit (may be the most significant bit, or the first bit). A "1" in the sign bit may indicate a negative value, and a "0" may indicate not-negative (i.e. positive including zero). FIG. 1 table 100 illustrates the results of the example transformation in column 106.

As will be described in greater detail in FIG. 5, an inverse transformation of data saved in an SSD format to a two's complement format may be performed when data is to be read from the SSD. In some examples, the inverse transformation may include: (1) begin with an integer represented in an SSD format, (2) determine the sign of the integer, (3) if positive (including zero), then set the sign bit by making the most significant bit "0", (4) else if negative, then take the 1's complement of the integer.

In the table 100, a two's complement binary 104 for integer "2" may be expressed as a 16-bit binary value "0000 0000 0000 0010". Since a sign bit for the integer "2" may be illustrated as "0", a transformed binary 106 may be determined by determining a 1's complement of the transformed binary 106 for integer "2", shown as a 16-bit binary value "1111 1111 1111 1101". Similarly, a two's complement binary 104 for "−1" may be expressed as a 16-bit binary value "1111 1111 1111 1111". Since the sign bit for integer "−1" may be designated by a "1", a transformed binary 106 may be determined by clearing a sign bit of transformed binary 106 for integer "−1", as shown by a 16-bit binary value "0111 1111 1111 1111".

It may be seen from the table 100, that the smaller the absolute values, the more "1"s the transformed binary 106 may have, regardless of the sign. As illustrated, the transformed binary 106 may have more "1"s for integers with smaller values as compared to conventional methods. For example, the integer "0" may be represented as 16 bit "1"s. Referring to the example above, {2, 1, 0, −1, −2}, the 80 bits used to represent the transformed integers may now have 5 zero values. In contrast, as provided above, the original two's complement values used 47 zero values. Therefore, writing the transformed values to an SSD may require the use of fewer "0"s for this example. Additionally, the transformed data may be no larger than the two's complement data with each format requiring only 80 bits.

In FIG. 1, the integer value of "0" when transformed using the example transformation may be composed of entirely "1" value bits such that the 16 bit transformed representation of "0" may be composed of 16 "1" bits as illustrated in column 106.

It should be appreciated by one skilled in the art that the transformation may be applicable to any bit width (e.g., 16 bit, 32 bit, etc.) including any type of data format such, as but not limited to, a floating point type data format, and accordingly, the claimed subject matter is not limited in these respects. Modifications may be made to the example transformation provided above to store different data types, for example a floating point data type may include an exponent and a mantissa, which may require the application of the transformation separately to the exponent part and the mantissa part. Additionally, the transformation may be applicable to unsigned integer data.

Further, an offset may be added to the input value prior to transformation so that the mode value of the input data may be moved to zero. Accordingly, the offset may be subtracted after inverse transformation to determine the original input value.

The transform and the inverse transform operations of a two's complement system may be further described with reference to FIGS. 2A and 2B.

Figure 2B:
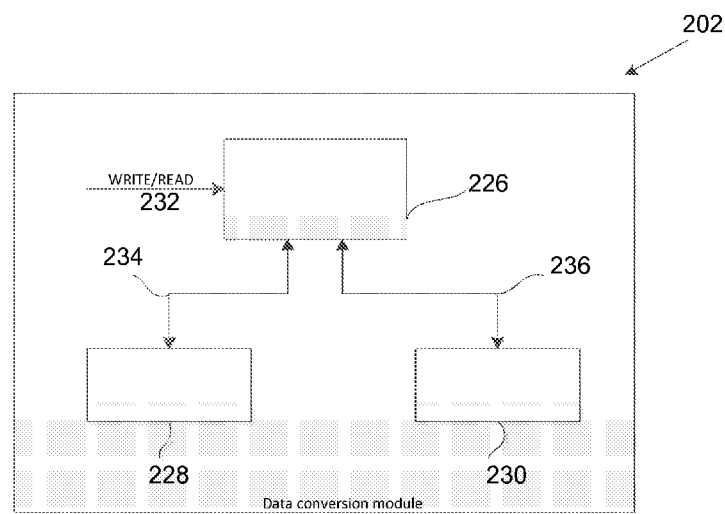

FIGS. 2A and 2B illustrate an example system 200 that is arranged in accordance with at least some embodiments of the present disclosure. As illustrated, the system 200 may include a memory control module 202 communicatively coupled to an SSD. Additionally, the memory control module 202 may include one or more components, a receive data module 206, a data conversion module 208, a write data module 210, and a read data module 212. The one or more components of the memory control module 202 may be illustrated as individual components, but it should be appreciated that the receive data module 206, the data conversion module 208, the write data module 210, and/or the read data module 212 may be combined as a unitary component, may be external components, or may be any combination thereof.

In some examples, the memory control module 202 may be communicatively coupled with the SSD 204, where the memory control module 202 may be configured for write, read, or erase operations.

The receive data module 206 may be communicatively coupled with an external interface (not shown) via a communication channel 214. In some examples, the external interface may be a host machine that may be configured to access the SSD 204 for data storage. The receive data module 206 may be operable to receive the data to be written into the SSD 204 from the external interface and may be further operable to forward the data retrieved from SSD 204 to the external interface.

In accordance with at least some embodiments, the data conversion module 208 may be communicatively coupled with the receive data module 206 via a communication channel 216. The data conversion module 208 may be operable to receive data from receive data module 206 for writing to SSD 204 (e.g., receiving data for a write operation). Additionally, the data conversion module 208 may be operable to convert the received data into an SSD formatted data and to forward it to write data module 210. The data conversion module 208 may be further operable to convert the SSD formatted data received from the read data module 212 (e.g., as a result of a read operation of SSD 204), back into the received data.

In some examples, the write data module 210 may be operable to receive the SSD formatted data from the data conversion module 208 via one or more communication signals 218 and operable to process the received signals to facilitate writing into the SSD 204 via the write communication channel 222. In some examples, the read data module 212 may be operable to receive SSD formatted data read from the SSD 204 via a read communication channel 224 as a result of a read operation, and to forward the read data to the data conversion module 208 via one or more signals 220. In some examples, the write data module 210 and the read data module 212 may be combined into one functional unit operable to send and/or receive communication signals to/from the data conversion module 208 and to write and/or read from SSD 204. The data conversion module 208 may be described in further detail with respect to FIG. 2B.

In some examples, an offset may be used to set the mode value of sample data or a sample data set to zero. In some examples, the data conversion module 208 may be configured to add an offset prior to any transformation from the received data format to SSD format. In some examples, the data conversion module 208 may be configured to subtract an offset after inverse transformation from the SSD formatted data to the original received data format.

FIG. 2B illustrates an example of data conversion module 208, arranged in accordance with at least some embodiments described herein. The data conversion module 208 may include one or more of a determining module 226, a transforming module 228, and/or an inverse transforming module 230. The components of the data conversion module 208 may be illustrated as individual components, but it should be appreciated that, in some examples embodiments, the determining module 226, the transforming module 228, and the inverse transforming module 230 may be combined as a unitary component, may be external components, or may be any combination thereof. Additionally, in some examples the determining module 226, the transforming module 228, and the inverse transforming module 230 may be implemented as a machine readable, non-transitory medium having machine-executable instructions or data structures stored thereon. In some embodiments, the transforming module 228 and the inverse transforming module 230 may be logically and/or physically identical and/or contain partly overlapping component parts.

The determining module 226 may be operable to determine the sign of an input data value. In an example, a write/read signal 232 may represent one or more signals for write or read access to the SSD 204. For a write operation to the SSD 204, the determining module 226 may receive the data to be written from the receive data module 206. The determining module 226 may further be operable to determine if the received data has a value that is greater or equal to "0" and may forward the received data to the transforming module 228 via a signal 234. For a read operation from the SSD 204, the determining module 226 may receive the complementary representation data from the read data module 212. The determining module 226 may be further operable to determine if the complementary representation data has a value less than "0" and to forward the complementary representation data to the inverse transforming module 230 via a signal 236.

The transforming module 228 may be operable to transform the received data into an SSD formatted data by either taking the 1's complement of non-negative input data or by clearing the sign bit of negative input data. An example for transforming the received data in to a complementary representation data may be described with reference to FIG. 3.

The inverse transforming module 230 may be operable to inverse transform the SSD formatted data by either taking the 1's complement of negative input data or by setting the sign bit of non-negative input data. An example embodiment for restoring the complementary representation data back to the received data may be described with reference to FIG. 4.

As illustrated with reference to FIGS. 2A-2B, the data for a write operation into the SSD 204 may be converted to an SSD formatted data by a transform operation in order to reduce writing number of "0"s for reducing wear of the SSD 204. Additionally, the SSD formatted data read from the SSD 204 may be converted back to the received data by an inverse-transform operation.

The data conversion module 208, including the determining module 226, transforming module 228, and/or inverse transforming module 230 may be modified as necessary to further support transformation and inverse transformation of different number formats, including, but not limited to unsigned integers and floating point numbers. Because floating point numbers may be composed of exponent and mantissa components, each of the exponent and mantissa may be transformed and/or inverse transformed using separate data conversion modules such as the example data conversion module 208. In some examples, the data conversion module 208 may be configured to support number formats of varying bit width and varying component parts (such as exponent and mantissa).

Figure 3:
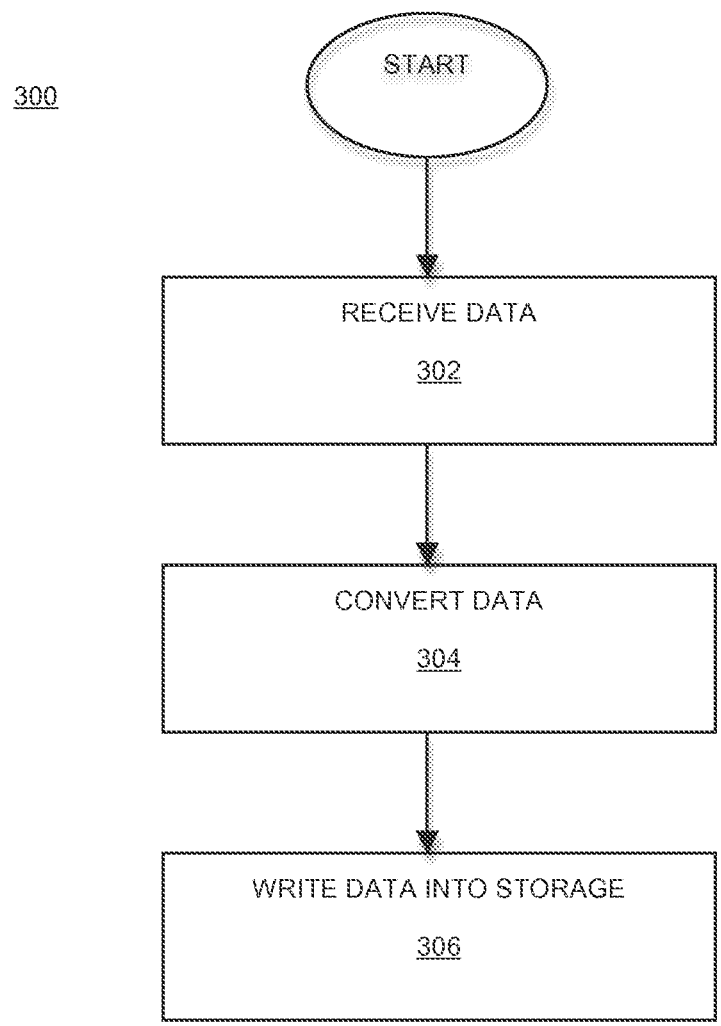
FIG. 3 illustrates an example process for converting data for a write operation in accordance with at least some embodiments of the present disclosure.

FIG. 3 illustrates an example process 300 for converting data for a write operation in accordance with at least some embodiments of the present disclosure. In the illustrated example, process 300, and other processes described herein, set forth various functional blocks or actions that may be described as processing steps, functional operations, events and/or acts, etc., which may be performed by hardware, software, and/or firmware. Those skilled in the art in light of the present disclosure will recognize that numerous alternatives to the functional blocks shown in FIG. 3 may be practiced in various implementations. For example, although process 300, as shown in FIG. 3, may comprise one particular order of blocks or actions, the order in which these blocks or actions are presented does not necessarily limit claimed subject matter to any particular order. Likewise, intervening actions not shown in FIG. 3 and/or additional actions not shown in FIG. 3 may be employed and/or some of the actions shown in FIG. 3 may be eliminated, without departing from the scope of claimed subject matter. Example process 300 may include one or more of functional operations as indicated by example operations 302, 304, and/or 306.

As illustrated, example process 300 may be implemented for converting data for a write operation in accordance with at least some embodiments of the present disclosure (see, e.g., FIGS. 1 and 2). Processing may begin at operation 302, "RECEIVE DATA", where data for a write operation may be received at a memory control module (e.g., memory control module 202 in FIG. 2A).

Processing may continue from operation 302 to operation 304, "CONVERT DATA", where the received data may be converted into an SSD formatted data (e.g., table 100 in FIG. 1). In some examples, the complementary representation data may be substantially the same size as compared to the received data and optimized for storage into the solid state storage device.

Processing may continue from operation 302 to operation 306, "WRITE DATA INTO STORAGE", where the SSD formatted data may be written into a solid state storage device (e.g., SSD in FIG. 204).

In some examples, an offset may be used to set the mode of the data or data set to zero. In some examples, the data received at receive data 302 may be presented with an included offset prior to any transformation from the received data format to SSD format.

Figure 4:
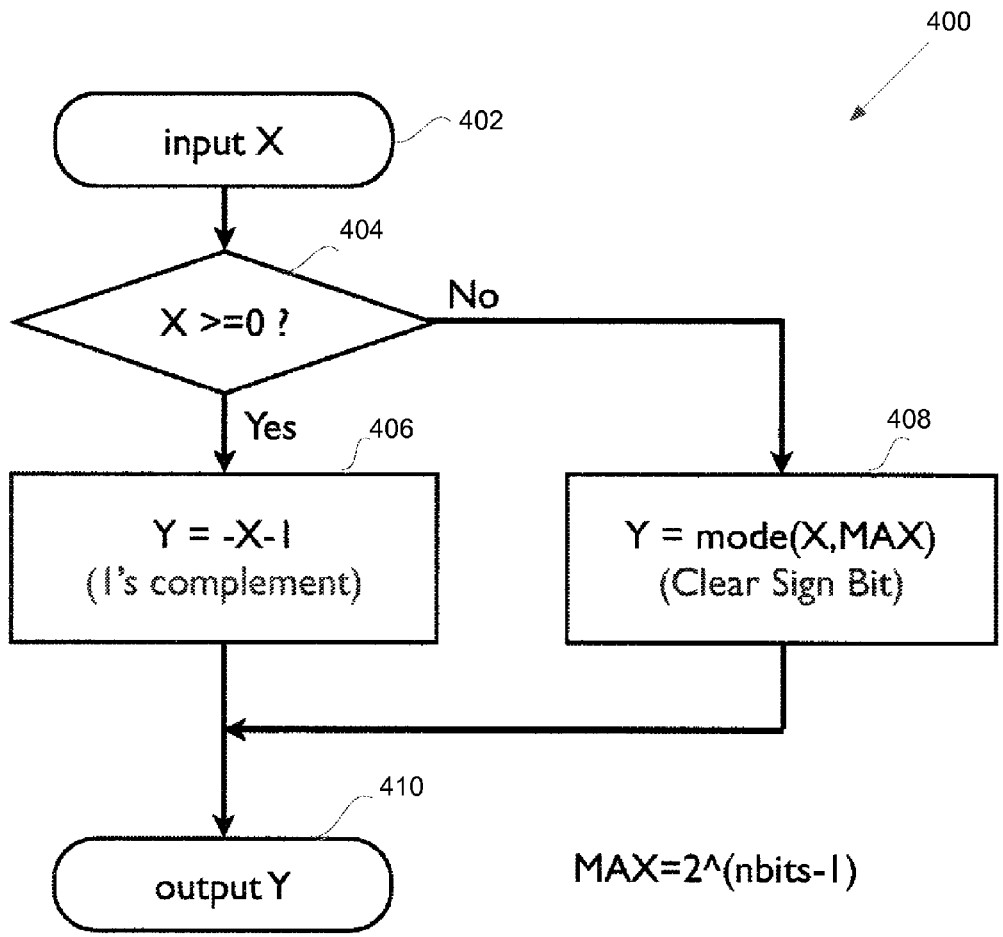
FIG. 4 illustrates an example process, which may be executed by data conversion module that may be configured to transform the received data, in accordance with various embodiments disclosed herein.
Figure 5:
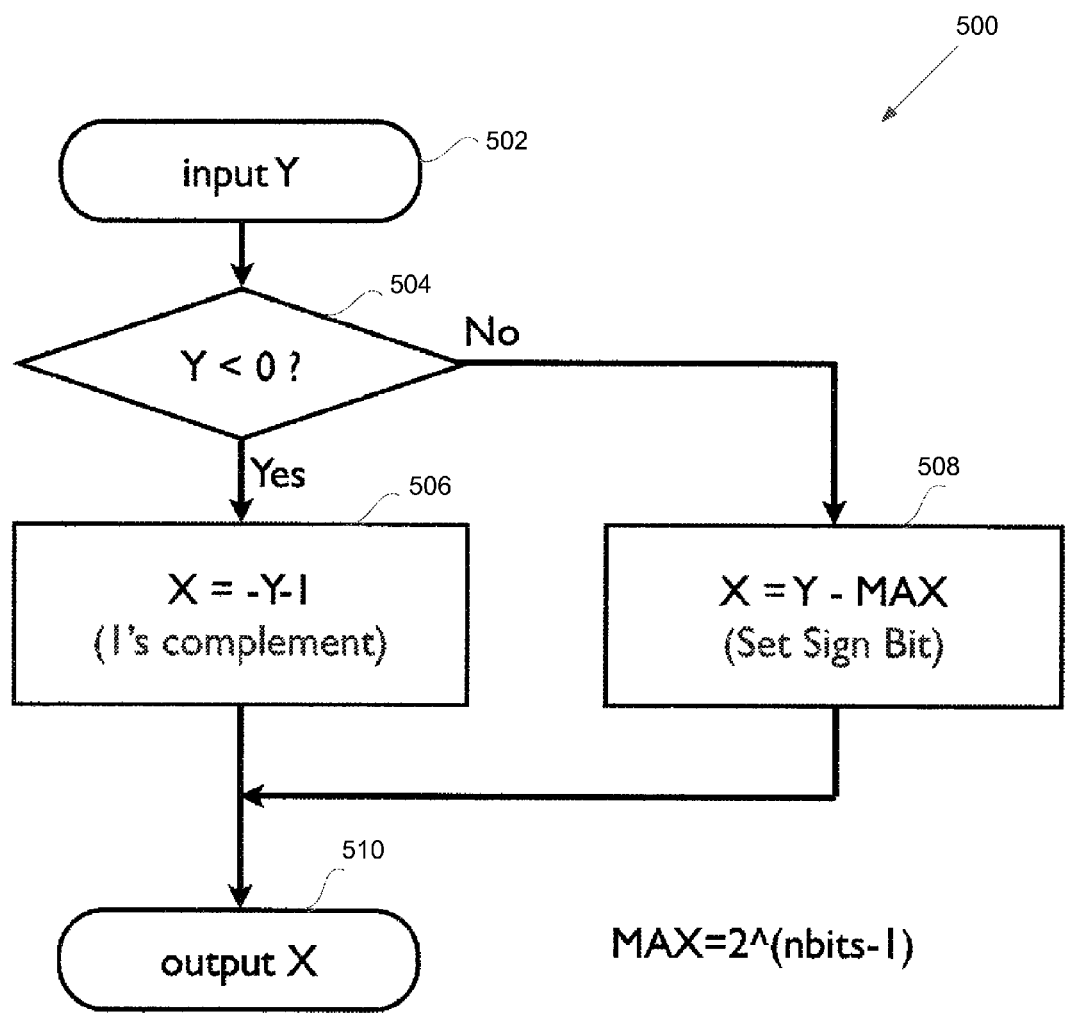
FIG. 5 illustrates an example process, which may be executed by the data conversion module that may be configured to perform inverse transformation, in accordance with an aspect of the present disclosure.

Further details of example process 300 may be described with regards to FIG. 4 and FIG. 5.

FIG. 4 illustrates an example process 400, which may be executed by data conversion module 208 that may be configured to transform the received data, in accordance with various embodiments disclosed herein. In the illustrated example, process 400, and other methods described herein, set forth various functional blocks or actions that may be described as processing steps, functional operations, events and/or acts, etc., which may be performed by hardware, software, and/or firmware. Those skilled in the art in light of the present disclosure will recognize that numerous alternatives to the functional blocks shown in FIG. 4 may be practiced in various implementations. For example, although process 400, as shown in FIG. 4, may comprise one particular order of blocks or actions, the order in which these blocks or actions are presented does not necessarily limit claimed subject matter to any particular order. Likewise, intervening actions not shown in FIG. 4 and/or additional actions not shown in FIG. 4 may be employed and/or some of the actions shown in FIG. 4 may be eliminated, without departing from the scope of claimed subject matter. Process 400 may include one or more of operations as illustrated by blocks 402, 404, 406, 408, and/or 410.

FIGS. 4 and 5 may refer to example data X and Y. For clarity, FIG. 4 may be described using X and Y, where X may represent a two's complement formatted data and Y may represent an example SSD formatted data. FIG. 5 may continue to be described using X and Y, where X may represent a two's complement formatted data and Y may represent an example SSD formatted data.

As illustrated, process 400 may start at operation 402, "input X", when an input data X may be received for converting the received data into an SSD formatted data. In one example, input data X may be an integer expressed in two's complement binary system. Referring back to FIG. 2A, input data X may be received by the receive data module 206 via one or more signals 214 from an external interface.

Processing may continue from operation 402 to operation 404, "X>=0?", where it may be determined whether input data X is a positive integer or a negative integer. Referring back to FIG. 2B, the determining module 226 may receive input data X from the receive data module 206 and may determine if the received data has a value that is greater or equal to "0". If it is determined that the received data has a value that is greater or equal to "0", the determining module 226 may forward the received data to the transforming module 228, and the process may continue from operation 404 to operation 406, "Y=-X-1 (1's complement)", where the one's complement of input data X may be performed. If it is determined that the received data has a value that is not greater or equal to "0", the determining module 226 may forward the received data to the transforming module 228, and the process may continue from operation 404 to operation 408, "Y=mode (X,MAX) (Clear Sign Bit)", where a sign bit of input data X may be cleared.

In operation 406, a one's complement of input data X may be determined by inverting the bits into the binary representation of input data X. The one's complement binary numeral system may be characterized by the bit complement of any integer value being the arithmetic negative of the value, where inverting the bits of a number may produce substantially the same result as subtracting the value from 0. The one's complement of input data X may be generated as output data Y, where Y=-X-1 (negate X and subtract "1"), in operation 406. Processing may continue from operation 406 to operation 410, "output Y", where the output data Y may be output.

In operation 408, the sign bit may be cleared by determining the mode (X, MAX), where MAX is $(2^{N-1})$ for an N-bit number and output data Y may be forwarded to operation 410.

Operation 410 may denote the end of process 400, where the output data Y may represent the SSD formatted data, and the SSD formatted data may be forwarded to the write data module 210 for writing in to the SSD 204 in FIG. 2.

As discussed with reference to FIG. 4, in one example, a transform operation may be performed for input data X. If the input data X may have a value that is greater than or equal to "0", the one's complement of input data X may be determined for output data Y. If the input data X may have a value less than "0", sign bit of input data X may be cleared to determine output data Y. The output data Y may represent the transformed binary data, in accordance with various embodiments disclosed herein.

In some examples, an offset may be used to set the mode of the data or data set to zero. In some examples, the input X 402 may include an offset prior to transformation from the received data format to SSD format.

FIG. 5 illustrates an example process 500, which may be executed by the data conversion module 408 that may be configured to perform inverse transformation, in accordance with an aspect of the present disclosure. In the illustrated example, process 500, and other processes described herein, set forth various functional blocks or actions that may be described as processing steps, functional operations, events and/or acts, etc., which may be performed by hardware, software, and/or firmware. Those skilled in the art in light of the present disclosure will recognize that numerous alternatives to the functional blocks shown in FIG. 5 may be practiced in various implementations. For example, although process 500, as shown in FIG. 5, may comprises one particular order of blocks or actions, the order in which these blocks or actions are presented does not necessarily limit claimed subject matter to any particular order. Likewise, intervening actions not shown in FIG. 5 and/or additional actions not shown in FIG. 5 may be employed and/or some of the actions shown in FIG. 5 may be eliminated, without departing from the scope of claimed subject matter. Process 500 may include one or more operations as illustrated by blocks 502, 504, 506, 508 and/or 510.

As illustrated, process 500 may start at operation 502, "input Y", when an input data Y is received for performing inverse transformation. In one example, input data Y may be the complementary representation data received from the read data module 212 as a result of a read operation of the SSD 204.

Processing may continue from operation 502 to operation 504, "Y<0?", where it may be determined if input data Y has a value less than "0". Referring back to FIG. 2B, the determining module 226 may receive input data Y from the read data module 212 and may determine if the input data Y has a value less than "0". If it determined that the input data Y has a value less than "0", the determining module 226 may forward to the input data to the inverse transforming module 230, and processing may continue from operation 504 to operation 506, "X=-Y-1 (1's complement)", where the one's complement of input data Y may be performed. If it determined that the input data Y has a value that is not less than "0", the determining module 226 may forward to the input data to the inverse transforming module 230, and processing may continue from operation 504 to operation 508, "X=Y-MAX (Set Sign Bit)", where a sign bit may be set.

In operation 506, the inverse transforming of input data Y may be performed by changing sign of input data Y and subtracting "1". As illustrated, one's complement of input data Y may be generated as X=-Y-1 (negate Y and subtract "1"). Processing may continue from operation 506 to operation 510, "output X", where the X may be output. In one example, input data Y may represent complementary representation data that may be converted back to the two's complement binary data X, as which may have been originally received for writing into the SSD 204.

In operation 508, the sign bit may be set by generating X=Y-MAX, and the output X may be forwarded to operation 510.

Operation 510 may denote the end of process 500, where the output X may represent the two's complement data as may have been originally received for writing into the SSD 204. The output X may be forwarded to receive data module 210, which may represent the data read from the SSD 204 as a result of a read operation.

As discussed with reference to FIG. 5, an inverse transform operation of input data Y may be performed, in accordance with various embodiments disclosed herein. If input data Y has a value that is less than "0", the one's complement of input data Y may be determined for the output X. If input data Y has a value that is greater or equal to "0", the sign bit of input data Y may be set to determine the output X. The output X may represent the original received data in the two's complement format.

In some examples, an offset may be used to set the mode of the data or data set to zero. In some examples, the output X

510 may subtract an offset after transformation from the received data format to SSD format.

In general, the methods described with respect to FIGS. 3, 4 and 5 and elsewhere herein may be implemented as a computer program product, executable on any suitable computing system, or the like. For example, a computer program product for providing data center access and management settings transfer services may be provided. Example computer program products may be described with respect to FIG. 6 and elsewhere herein.

Figure 6:
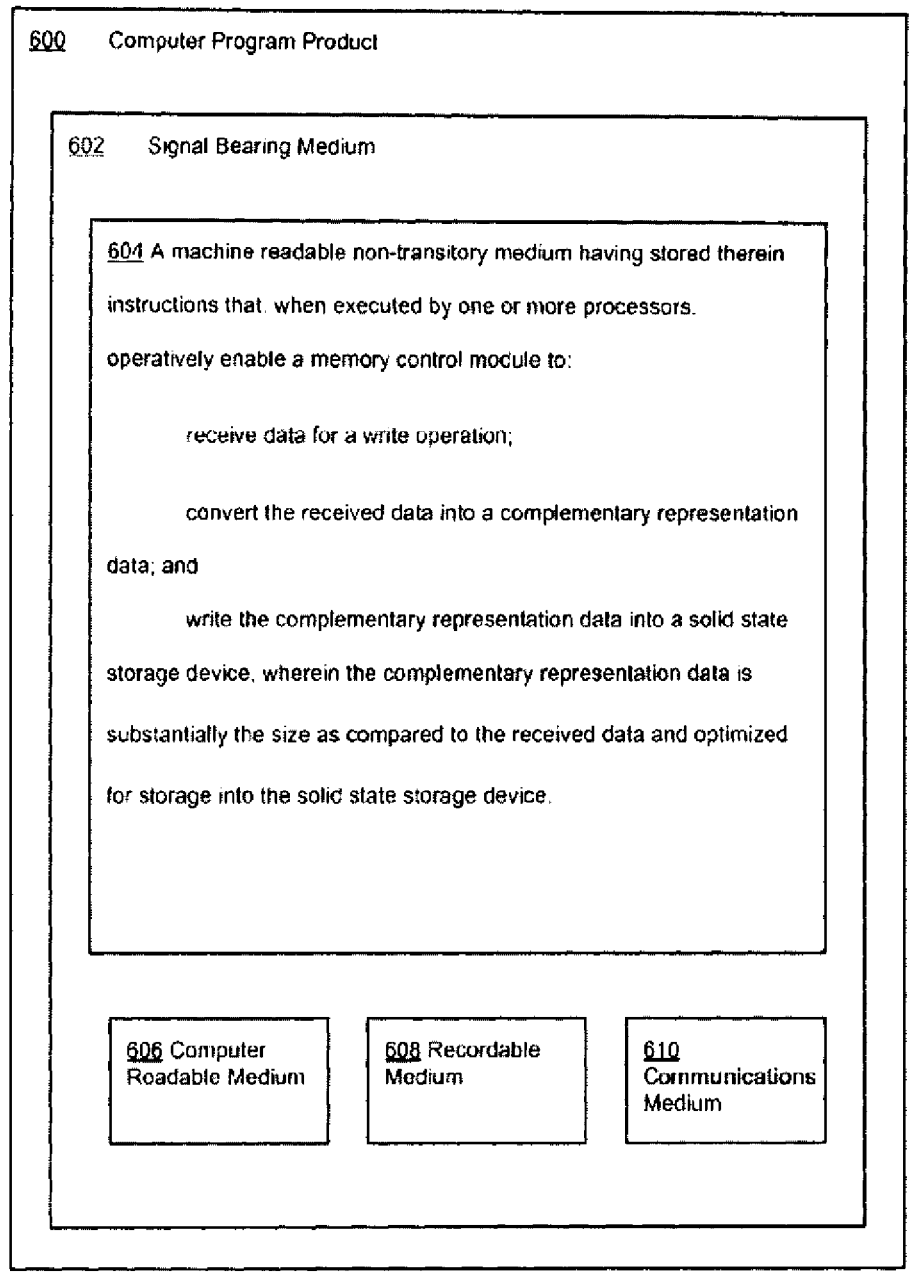
FIG. 6 illustrates an example computer program product that may be arranged in accordance with at least some embodiments described herein.
Figure 7:
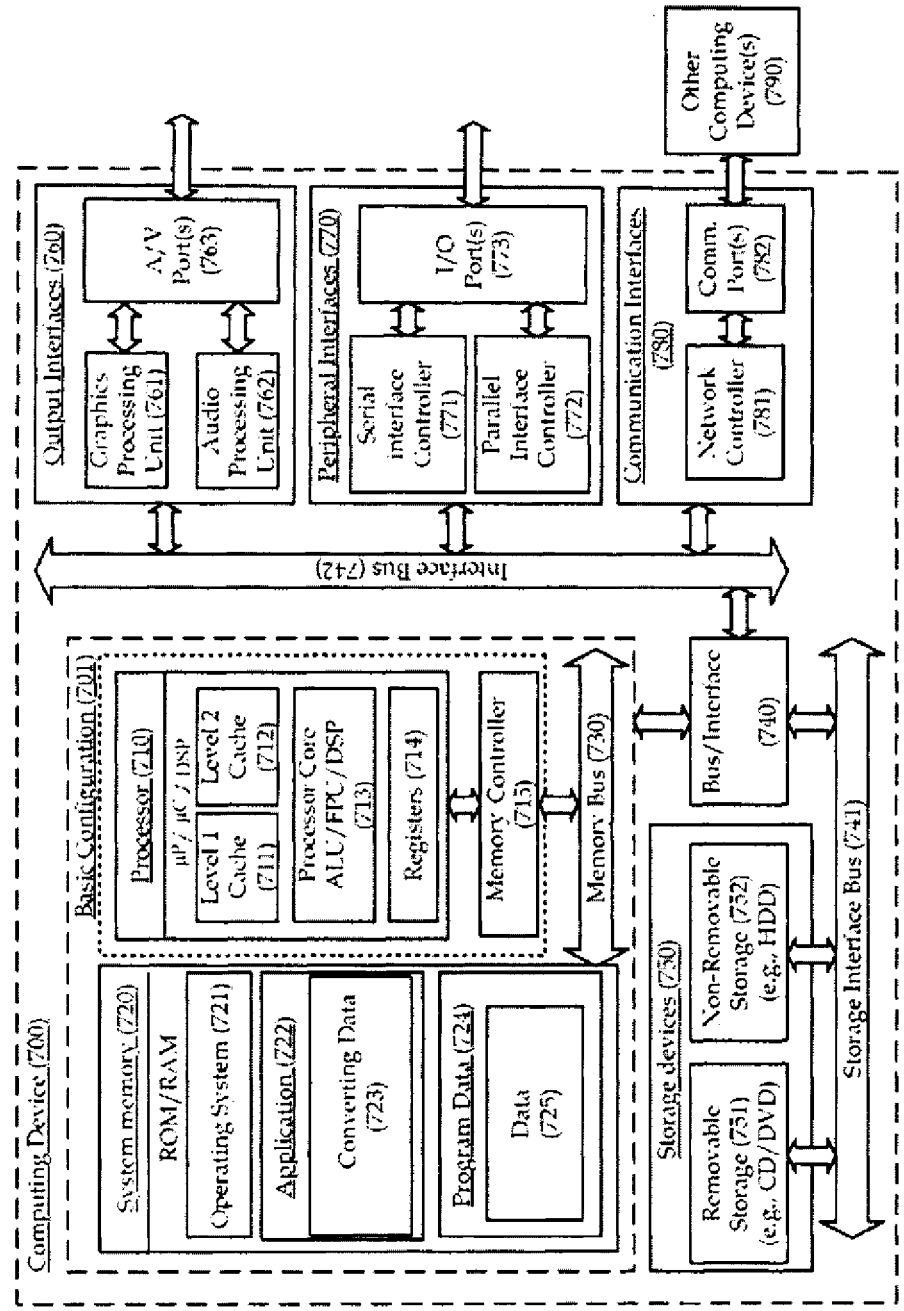

FIG. 6 illustrates an example computer program product 600 that may be arranged in accordance with at least some embodiments described herein. The program product 600 may include a signal bearing medium 602. The signal bearing medium 602 may include a machine readable non-transitory medium having stored therein instructions 604 that, if executed by one or more processors, may operatively enable a computing device to provide the functionality described above with respect to FIGS. 3, 4, and 5. Thus, for example, the memory control module 208 (shown in FIGS. 2A and 2B) may undertake one or more of the actions shown in FIG. 3 in response to the execution of the instructions 604 conveyed by the signal bearing medium 602.

In some implementations, the signal bearing medium 602 may encompass a non-transitory computer-readable medium 606, such as, but not limited to, a hard disk drive, a Compact Disc (CD), a Digital Versatile Disk (DVD), a digital tape, memory, etc. In some implementations, the signal bearing medium 602 may encompass a recordable medium 608, such as, but not limited to, memory, read/write (R/W) CDs, R/W DVDs, etc. In some implementations, the signal bearing medium 602 may encompass a communications medium 610, such as, but not limited to, a digital and/or an analog communication medium (e.g., a fiber optic cable, a waveguide, a wired communications link, a wireless communication link, etc.).

Figure 7:
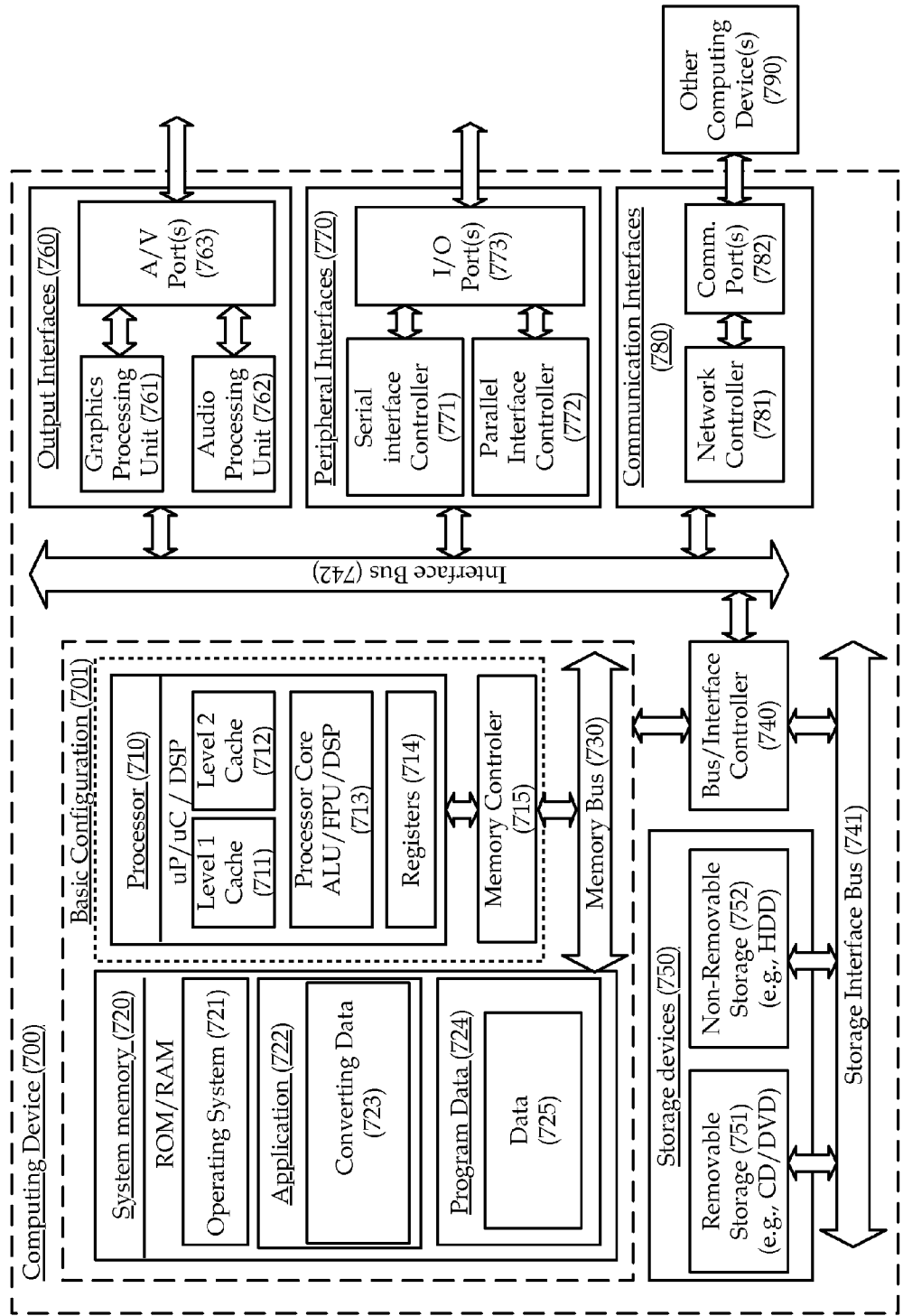
FIG. 7 is a block diagram illustrating an example computing device, such as might be embodied by a person skilled in the art, all arranged in accordance with at least some embodiments described herein.

FIG. 7 is a block diagram illustrating an example computing device 700, such as might be embodied by a person skilled in the art, which is arranged in accordance with at least some embodiments described herein. In various examples, computing device 700 may be configured to improve life of a solid state storage device as discussed herein. In various examples, computing device 700 may be configured convert data into a complementary representation data discussed herein.

In one example of a basic configuration 701, the computing device 700 may include one or more processors 710 and a system memory 720. A memory bus 730 may be used for communicating between the one or more processor 710 and the system memory 720.

Depending on the desired configuration, the one or more processor 710 may be of any type including but not limited to a microprocessor (µP), a microcontroller (µC), a digital signal processor (DSP), or any combination thereof. The one or more processor 710 may include one or more levels of caching, such as a level one cache 711 and a level two cache 712, a processor core 713, and registers 714. The processor core 713 may include an arithmetic logic unit (ALU), a floating point unit (FPU), a digital signal processing core (DSP Core), or any combination thereof. A memory controller 715 may also be used with the one or more processor 710, or in some implementations the memory controller 715 may be an internal part of the one or more processor 710.

Depending on the desired configuration, the system memory 720 may be of any type including but not limited to volatile memory (such as RAM), non-volatile memory (such as ROM, flash memory, etc.) or any combination thereof. The system memory 720 may include an operating system 721, one or more applications 722, and program data 724. The one or more applications 722 may include converting data algorithm 723 that is arranged to perform the functions as described herein including the functional blocks and/or actions described with respect to the process 300, 400, and 500 of FIGS. 3, 4, and 5. The program data 724 may include data 725 for use with the converting data algorithm 723. In some example embodiments, the one or more applications 722 may be arranged to operate with program data 724 on the operating system 721 such that implementations of converting data for write and/or read into and/or from a solid state storage device may be provided as described herein. For example, the system 200 (shown in FIG. 2) may comprise all or a portion of the computing device 700 and may be capable of performing all or a portion of the one or more applications 722 such that implementations of converting data may be provided as described herein. This described basic configuration 701 is illustrated in FIG. 7 by those components within dashed line.

The computing device 700 may have additional features or functionality, and additional interfaces to facilitate communications between the basic configuration 701 and any required devices and interfaces. For example, a bus/interface controller 740 may be used to facilitate communications between the basic configuration 701 and one or more data storage devices 750 via a storage interface bus 741. The one or more data storage devices 750 may be removable storage devices 751, non-removable storage devices 752, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

The system memory 720, the removable storage devices 751 and the non-removable storage devices 752 are all examples of computer storage media. The computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by the computing device 700. Any such computer storage media may be a part of the computing device 700.

The computing device 700 may also include an interface bus 742 for facilitating communication from various interface devices (e.g., output interfaces, peripheral interfaces, and communication interfaces) with the basic configuration 701 via the bus/interface controller 740. Example output interfaces 760 may include a graphics processing unit 761 and an audio processing unit 762, which may be configured to communicate to various external devices such as a display or speakers via one or more NV ports 763. Example peripheral interfaces 760 may include a serial interface controller 771 or a parallel interface controller 772, which may be configured to communicate with external devices such as input devices (e.g., keyboard, mouse, pen, voice input device, touch input device, etc.) or other peripheral devices (e.g., printer, scanner, etc.) via one or more I/O ports 773. An example communication interface 780 includes a network controller 781, which may be arranged to facilitate communications with one or more other computing devices 790 over a network communication via one or more communication ports 782. A communication connection is one example of a communication media. The communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), infrared (IR) and other wireless media. The term computer readable media as used herein may include both storage media and communication media.

The computing device 700 may be implemented as a portion of a small-form factor portable (or mobile) electronic device such as a cell phone, a personal data assistant (PDA), a personal media player device, a wireless web-watch device, a personal headset device, an application specific device, or a hybrid device that may include any of the above functions. The computing device 700 may also be implemented as a personal computer including both laptop computer and non-laptop computer configurations. In addition, the computing device 700 may be implemented as part of a wireless base station or other wireless system or device.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

The claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a signal bearing medium, a storage medium and/or storage media. This storage media, such as CD-ROMs, computer disks, flash memory, or the like, for example, may have instructions stored thereon, that, when executed by a computing device, such as a computing system, computing platform, or other system, for example, may result in execution of a processor in accordance with the claimed subject matter, such as one of the implementations previously described, for example. As one possibility, a computing device may include one or more processing units or processors, one or more input/output devices, such as a display, a keyboard and/or a mouse, and one or more memories, such as static random access memory, dynamic random access memory, flash memory, and/or a hard drive.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be affected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain example techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed:

1. A method for data storage, comprising:
   at a memory control module, detecting data for a write operation;
   converting the detected data into a complementary representation data;
   writing the complementary representation data into a solid state storage device, wherein the complementary representation data is substantially a same size as compared to the detected data and configured for storage into the solid state storage device; and subtracting a central value from the detected data prior to converting the detected data.

2. The method of claim 1, further comprising:

determining if the detected data has a value that is greater than or equal to 0;

wherein converting the detected data into the complementary representation includes:

in response to determination that the detected data has the value that is greater than or equal to 0, transforming the detected data into the complementary representation data by determining 1s complement binary; and in response to determination that the detected data has the value that is not greater than or equal to 0, transforming the detected data into the complementary representation data by clearing a sign bit of the detected data.

3. The method of claim 1, wherein detecting data for the write operation comprises detecting that the data is in a binary two's complement form.

4. The method of claim 1, further comprising:

responsive to a request for a read operation, reading the complementary representation data from the solid state storage device; and converting the complementary representation data back into the detected data.

5. The method of claim 4, wherein converting the complementary representation data back into the detected data comprises:

determining whether the complementary representation data has a value less than 0;

in response to determination that the complementary representation data has the value less than 0, determining 1s complement binary for the complementary representation data; and in response to determination that the complementary representation data has the value that is not less than 0, setting a sign bit of the complementary representation data.

6. The method of claim 5, further comprising:

adding the central value that was subtracted from the detected data.

7. A machine readable non-transitory medium that includes instructions stored therein that, in response to execution by one or more processors, operatively enable a memory control module to:

detect data for a write operation;

convert the detected data into a complementary representation data; and write the complementary representation data into a solid state storage device, wherein the complementary representation data is substantially a same size as compared to the detected data and configured for storage into the solid state storage device;

wherein the instructions that operatively enable the memory control module to convert the detected data into the complementary representation data include instructions to operatively enable the memory module to:

determine whether the detected data has a value that is greater than or equal to 0;

in response to determination that the detected data has the value that is greater than or equal to 0, transform the detected data into the complementary representation data by determining 1s complement binary; and in response to determination that the detected data has the value that is not greater than or equal to 0, transform the detected data into the complementary representation data by clearing a sign bit of the detected data.

8. The machine readable non-transitory medium of claim 7, further including instructions stored therein that, in response to execution by one or more processors, further operatively enable the memory control module to:

subtract a central value from the detected data prior to conversion of the detected data into the complementary representation data.

9. The machine readable non-transitory medium of claim 7, wherein the instructions that operatively enable the memory control module to detect the data include instructions that, in response to execution by one or more processors, operatively enable the memory control module to detect data in a binary two's complement form.

10. The machine readable non-transitory medium of claim 7, further including instructions stored therein that, in response to execution by one or more processors, further operatively enable the memory control module to:

responsive to a request for a read operation, read the complementary representation data from the solid state storage device; and convert the complementary representation data back into the detected data.

11. The machine readable non-transitory medium of claim 10, wherein the instructions that operatively enable the memo control module to convert the complementary representation data back into the detected data include instructions that, in response to execution by one or more processors, operatively enable the memory control module to:

determine whether the complementary representation data has a value less than 0;

in response to determination that the complementary representation data has the value less than 0, determine 1s complement binary for the complementary representation data; and in response to determination that the complementary representation data has the value that is not less than 0, set a sign bit of the complementary representation data.

12. The machine readable non-transitory medium of claim 11, wherein the instructions that operatively enable the memo control module to convert the complementary representation data back into the detected data include instructions that, in response to execution by one or more processors, further operatively enable the memory control module to add a central value that was previously subtracted from the detected data.

13. A system, comprising:

a solid state storage device; and a memory control module, the memory control module communicatively coupled to the solid state storage device, the memory control module being configured to:

detect data for a write operation;

convert the detected data into a complementary representation data;

write the complementary representation data into the solid state storage device, wherein the complementary representation data is substantially a same size as compared to the detected data and configured for storage into the solid state storage device;

determine whether the complementary representation data has a value less than 0;

in response to determination that the complementary representation data has the value less than 0, determine 1s complement binary for the complementary representation data; and in response to determination that the complementary representation data has the value that is not less than 0, set a sign bit of the complementary representation data.

14. The system of claim 13, wherein the memory control module is further configured to:
   subtract a central value from the detected data prior to conversion of the detected data.

15. The system of claim 13, wherein to convert the detected data into the complementary representation data, the memory control module is configured to:
   determine whether the detected data has a value that is greater than or equal to 0;
   in response to determination that the detected data has the value that is greater than or equal to 0, transform the detected data into the complementary representation data by determination of 1s complement binary; and
   in response to determination that the detected data has the value that is not greater than or equal to 0, transform the detected data into the complementary representation data by clearance of a sign bit of the detected data.

16. The system of claim 13, wherein the detected data is in a binary two's complement form.

17. The system of claim 13, wherein the memory control module is further configured to:
   responsive to a request for a read operation, read the complementary representation data from the solid state storage device; and
   convert the complementary representation data back into the detected data.

18. The system of claim 13, wherein the memory control module is further configured to add a central value that was previously subtracted from the detected data.

19. An apparatus, comprising:
   a memory control module configured to detect data for a write operation and to subtract a central value from the detected data;
   a conversion module coupled to the memory control module and configured to convert the detected data, with the central value subtracted therefrom, into a complementary representation data; and
   a write data module coupled the conversion module and configured to write the complementary representation data into a storage device, wherein the complementary representation data is substantially a same size as compared to the detected data and is configured for storage into the storage device.

20. The apparatus of claim 19, wherein the storage device includes a solid state storage device.

21. The apparatus of claim 19, wherein to convert the detected data into the complementary representation data, the conversion module is configured to:
   determine whether the detected data has a value that is greater than or equal to 0;
   in response to determination that the detected data has the value that is greater than or equal to 0, determine 1s complement binary to transform the detected data into the complementary representation data; and
   in response to determination that the detected data has the value that is not greater than or equal to 0, clear a sign bit of the detected data to transform the detected data into the complementary representation data.

22. The apparatus of claim 19, wherein:
   responsive to a request for a read operation, the memory control module is further configured to read the complementary representation data from the storage device; and
   the conversion module is further configured to convert the complementary representation data back into the detected data.

23. The apparatus of claim 19, wherein conversion module is further configured to:
   determine whether the complementary representation data has a value less than 0;
   in response to determination that the complementary representation data has the value less than 0, determine 1s complement binary for the complementary representation data; and
   in response to determination that the complementary representation data has the value that is not less than 0, set a sign bit of the complementary representation data.

* * * * *

UNITED STATES PATENT AND TRADEMARK OFFICE
CERTIFICATE OF CORRECTION

PATENT NO.        : 8,769,193 B2  
APPLICATION NO.   : 13/809384  
DATED             : July 1, 2014  
INVENTOR(S)       : Oh Page 1 of 3

It is certified that error appears in the above-identified patent and that said Letters Patent is hereby corrected as shown below:

Title Page, Item (56), under "OTHER PUBLICATIONS", in Column 2, Line 1, delete "et al" and insert -- et al. --, therefor.

In the Drawings

Delete Drawing Sheets 6 of 7 and 7 of 7 and substitute therefor with the attached Drawing Sheets 6 of 7 and 7 of 7. FIGS 6 and 7 have been corrected.

In the Specification

In Column 4, Line 46, delete "may be be" and insert -- may be --, therefor.

In Column 12, Line 58, delete "NV" and insert -- A/V --, therefor.

In the Claims

In Column 17, Line 59, in Claim 7, delete "memory module" and insert -- memory control module --, therefor.

In Column 18, Line 27, in Claim 11, delete "memo" and insert -- memory --, therefor.

In Column 18, Line 42, in Claim 12, delete "memo" and insert -- memory --, therefor.

Signed and Sealed this  
Twenty-seventh Day of January, 2015

Michelle K. Lee  
*Deputy Director of the United States Patent and Trademark Office*